United States Patent
Kaim et al.

(10) Patent No.: US 7,057,192 B2
(45) Date of Patent: Jun. 6, 2006

(54) RADIAL SCAN ARM AND COLLIMATOR FOR SERIAL PROCESSING OF SEMICONDUCTOR WAFERS WITH RIBBON BEAMS

(76) Inventors: Robert E. Kaim, 762 Washington St., Brookline, MA (US) 02446; Nicholas R. White, 9 Spy Rock Hill, Manchester, MA (US) 01944

( * ) Notice: Subject to any disclaimer, the term of this patent is extended or adjusted under 35 U.S.C. 154(b) by 0 days.

(21) Appl. No.: 11/049,264

(22) Filed: Feb. 2, 2005

(65) Prior Publication Data
US 2005/0173656 A1 Aug. 11, 2005

Related U.S. Application Data

(60) Provisional application No. 60/542,570, filed on Feb. 6, 2004.

(51) Int. Cl.
*H01J 37/20* (2006.01)
(52) U.S. Cl. .............. 250/492.21; 250/442.11
(58) Field of Classification Search ........ 250/492.21, 250/442.11
See application file for complete search history.

(56) References Cited

U.S. PATENT DOCUMENTS

| | | | | |
|---|---|---|---|---|
| 5,003,183 A | * | 3/1991 | Nogami et al. | 250/492.2 |
| 5,898,179 A | * | 4/1999 | Smick et al. | 250/492.21 |
| 6,207,959 B1 | * | 3/2001 | Satoh et al. | 250/442.11 |

* cited by examiner

*Primary Examiner*—Kiet T. Nguyen
(74) *Attorney, Agent, or Firm*—David Prashker

(57) ABSTRACT

Semiconductor wafers are sequentially mounted on a holder at one end of an arm which is pivoted about its other end. Each wafer is thereby passed on an arcuate path through a parallel-scanned or continuous ribbon-shaped beam for processing. The pivot axis is parallel to the centroid of the beam trajectories. By pre-orienting the wafers before loading, and by providing a second pivot between the arm and the holder, the angle between the beam and the wafer surface may be precisely adjusted to any arbitrary angle of interest. The geometry is such that this angle is constant over the processed area. Uniform processing requires a scanned ribbon beam to have a non-uniform scan velocity and a continuous ribbon beam to have a non-uniform intensity profile. The required non-uniformity is generated by a suitably shaped collimating magnet. When a suitable ribbon beam is unavailable, a beam of approximately circular shape may be used by translating the pivot axis, thereby moving the wafer in a two-dimensional pattern through the beam.

11 Claims, 12 Drawing Sheets

During Implant

Load Position

RADIAL SCAN ARM AND COLLIMATOR FOR SERIAL PROCESSING OF SEMICONDUCTOR WAFERS WITH RIBBON BEAMS

PRIORITY CLAIM

The present invention was first filed as the subject matter of U.S. Provisional Patent Application Ser. No. 60/542,570 filed Feb. 6, 2004 and entitled "Radial scan arm and collimator for serial processing of semiconductor wafers-with scanned beams."

FIELD OF THE INVENTION

The present invention applies to the processing of workpieces by ion beams. More particularly, the invention is directed to the ion implantation of workpieces, such as silicon wafers, with parallel continuous ribbon ion beams or scanned ribbon ion beams; and passes the workpiece over an arc-shaped path through the ion beam in a manner that gives greater control of the angle between the ions and the entire implanted surface of the workpiece, and allows for an improved control of the uniformity of the dose.

BACKGROUND OF THE INVENTION

Existing equipment and methods for ion implantation process wafers either singly or in batches. Batch processing is usually performed on spinning disks which pass the wafers through the ion beam. Most ion implanters used for serially processing 200 or 300 mm diameter single wafers operate by scanning the ion beam in one direction. Others ion implanters operate by passing the wafer through a continuous parallel uniform ribbon beam. Some recent commercial equipment utilizes a scheme for scanning a wafer in two dimensions in a raster pattern through a stationary ion beam. Various operational and structural details about these different kinds of ion implanters and systems is described by U.S. Pat. Nos. 4,234,797; 4,922,106; 4,980,562; 4,276,477; 5,834,786; 6,313,474; 5,003,183; 5,046,148; 5,180,918; and 6,313,484. The text of each cited patent, as well as its internally cited publications, is expressly incorporated by reference herein.

The Single Wafer Hybrid Ion Implantation Technique

Of particular interest is the conventionally known single wafer hybrid ion implantation technique in which a wafer is mechanically scanned in at least one direction through a ribbon-shaped ion beam. The ribbon beam may be scanned at a higher frequency in an orthogonal direction; or alternatively, the wafer is moved through a continuous ion beam of sufficient width that scanning is not required.

Prior to reaching the workpiece, the ion beam usually passes through a focusing device (e.g., a dipole magnet or electrostatic lens) whose focus coincides with the center of the beam scanning device, or the point of origin of a continuous beam, thereby rendering the beam trajectories substantially parallel.

For a single wafer system, the wafer mechanical scan usually consists of multiple passes of the wafer at constant velocity through the ribbon ion beam. During each pass, a constant velocity is maintained until one edge of the wafer has substantially cleared the location of the ribbon beam. Then, the wafer velocity is rapidly decelerated to zero; and then accelerated to a constant velocity in the opposite direction for a subsequent pass of the wafer through the ribbon ion beam. In the manner, the wafer is passed multiple times in opposite directions through the ribbon ion beam until the desired dose of ions has been implanted into the wafer.

Prior Art FIG. 1 shows conventionally known hybrid scan single wafer equipment in which a silicon wafer is mechanically scanned in a vertical direction through an ion beam, and which is electrostatically scanned in a horizontal direction. In operation, the ion beam is scanned so that it is always parallel to a fixed axis within a fraction of one degree. The wafer is scanned by mounting it on a holder attached to a vertical shaft which runs through air bearings. The scan velocity is typically up to 25 cm per second. It is desirable to minimize any variation in the incident angle of the ion beam at different parts of the wafer surface. It is also required to control and vary this incident angle by providing one or more tilt axes.

Such conventionally known implanter equipment is required to process over 100 wafers per hour, and sometimes processes over 300 wafers per hour; and each wafer process may involve several passes of the wafer through an ion beam. Therefore, over a typical ten-year lifetime use for the equipment, the scan mechanism may operate in excess of 10 million cycles.

The Equipment Problems Encountered in Single Wafer Hybrid Ion Implantation

The difficulties in engineering durable equipment for performing single wafer hybrid ion implantation include: (a) the need to minimize the mass of the moving assembly while retaining stiffness; (b) the need to provide a reliable seal between the vacuum in which the process occurs and the atmosphere; (c) the need to provide a means of tilting the wafer with respect to the beam axis; and (d) simultaneously, the need to keep the mechanism simple, reliable, and accessible for service.

However, moving mechanisms in vacuum are difficult to lubricate, and suffer from more rapid wear than those in atmosphere. Furthermore, lubricants are potential contaminants of the process; and friction in the vacuum will generate particles which can contaminate the wafer. It would be desirable to minimize or even eliminate friction within the vacuum; and to locate all bearings and other mechanisms involving friction, potential wear, and intermittent contact, in the atmosphere—where they are isolated from the process and where conventional methods of lubrication and maintenance may be freely used.

In addition, air bearings are reliable but expensive. The mass of the air bearing assembly's moving parts is high, making it more difficult to rapidly decelerate and accelerate the assembly in order to maximize the efficiency of the mechanical scanning.

The Other, Alternative Types of Ion Implanters Conventionally Available

Batch ion implanters can and do successfully provide uniform ion dosing of silicon wafers, even though the velocity of a wafer on a spinning disk varies with its radial coordinate on the disk. The ion uniformity is accomplished by varying either (i) the velocity with which either the disk is translated through the ion beam, or (ii) the velocity with which the ion beam is translated across the spinning disk—such that the velocity is proportional to 1/R, where R is the radial coordinate of the beam centroid on the disk relative to the spin axis. This approach is used in the prior art hybrid scan batch system illustrated in Prior Art FIG. 2, in which wafers are mounted on spinning disks, the beam is magnetically scanned, and the 1/R scan dependence is generated by means of the magnetic scan waveform.

Prior Art FIG. 3 shows the equipment disclosed by U.S. Pat. No. 5,834,786 in which a continuous ribbon beam is used, and wafers are mounted on a spinning disk. In this instance, the required radial dependence is present in the intensity profile along the long dimension of the ribbon beam, which is created by suitably shaped poles in the dipole analyzing magnet.

Also among the conventionally available assemblies and techniques for controlling the current density uniformity of ion beams are the following:

(A) The invention disclosed by U.S. Pat. No. 5,350,926 teaches the use of magnets for analyzing, shaping and rendering parallel an ion beam as well as the use of multipole elements (either integrated into bending magnets or as separate assemblies) for controlling the uniformity of the beam.

(B) In a commercial implanter sold by Mitsui Engineering and Shipbuilding (the MDI-100), a discrete multipole device is presented as a rectangular array of iron pole pieces mounted on a yoke which surrounds the ion beam. Each pole piece is individually excited by a separate coil wound around it. The resulting magnetic field is applied in the central rectangular aperture, through which the ribbon-shaped ion beam passes; and consists of spatially varying field components, which cause a local slight deflection of the trajectories for the ions passing through it. See for example, U.S. Pat. Nos. 5,834,786 and 5,350,926 for additional details of this arrangement.

(C) Prior Art FIG. 4 shows the equipment of Nogami et al, disclosed by U.S. Pat. No. 5,003,181,in which the wafer chuck is mounted on a radial arm and the chuck rotation motor is used to counter-rotate the wafer (axis F in Prior Art FIG. 4)—such that its motion has a uniform projection of velocity normal to the ribbon beam. This equipment, and the method of controlling it, suffer certain disadvantages which the present invention is intended to avoid, viz:

(i) The rotation mechanism which counter-rotates the wafer operates continuously at high duty cycle. It is required to have great precision and low backlash.

(ii) The motion from the implant location to the load position is a complex long motion requiring modest accelerations to ensure that the wafer is securely retained, thereby limiting overall throughput of the implant system (iii) The load position is not sufficiently remote from the beam and limits the space for instrumentation (iv) The required rotary motion involves active deceleration and acceleration during the passage of the wafer through the beam, in order to accomplish uniform projection of velocity on a straight line. This unfortunately introduces a high risk of backlash-generated velocity errors.

(D) In other recent prior art equipment, a beam spot smaller than the wafer is used, and the wafer is passed mechanically through the beam in a two-dimensional raster pattern. This involves high accelerations but does make possible uniform implantation with little or no systematic variation between the ion beam and the wafer surface. It can be reliably used at very low energies and high currents, should control of the uniformity of a ribbon beam prove too difficult to accomplish.

SUMMARY OF THE INVENTION

The present invention has multiple aspects. A first aspect provides an apparatus for ion implantation of flat planar workpieces, said apparatus comprising:

means of generating an ion beam of desired species and energy means of collimating the ion beam to form a parallel ribbon beam, travelling parallel to a longitudinal axis, and having a long dimension along a major transverse axis and a short dimension along a minor transverse axis;

an arm mounted on a first pivot, whose pivot axis is adjacent to the beam, parallel to said longitudinal axis, and located in or close to the plane containing said longitudinal axis and said major transverse axis;

means of controlling the current density of the parallel ribbon beam and rendering it proportional to the distance from the axis of said first pivot a chuck for a workpiece to be implanted attached to said arm by a second pivot whose axis is inclined to the first pivot, wherein the workpiece to be implanted is attached to said chuck, means to adjust said second pivot to incline the surface of the workpiece at a desired angle to the beam direction, means to rotate the arm through an angle, thereby moving the workpiece through the ribbon ion beam on an arc-shaped path at a desired angular velocity, effective to implant a desired substantially uniform dose of ions into the planar surface of the workpiece.

A second aspect of the invention provides a method of implanting a workpiece with a ribbon ion beam, said method comprising the steps of:

mounting a single workpiece to a chuck attached to an arm, the arm being attached to a first pivot so that the workpiece may be moved in an arc-shaped path, pivoting the chuck about a second axis inclined to the first axis until the workpiece is held with its exposed plane surface at a desired angle to the first axis;

passing the ribbon ion beam through electrostatic or magnetic lenses whose field is shaped to render the ion trajectories approximately parallel with the first pivot axis; and rotating the arm about the first pivot to move the workpiece through the ribbon ion beam at a constant angular velocity, thereby implanting the workpiece with a uniform dose of ions, implanted into the workpiece at a desired angle.

Another aspect of the invention is to provide means for mounting a workpiece such as a flat wafer to a chuck attached to one end of an arm, the other end of which is attached to a scan pivot rotating about a scan pivot axis aligned with the z-direction, and providing a scan actuator to move the arm at a controlled velocity in an arc-shaped path, so as to pass the workpiece in vacuum through the ion beam in a direction locally aligned with the y-axis, wherein the pivot incorporates a vacuum seal and the bearings and actuator are located outside the vacuum in atmosphere.

A further aspect of the invention is to provide a means of causing the ion beam to vary in current density in proportion to the distance from the scan pivot, thereby allowing a uniform dose of ions to be imparted in spite of the radial variation of the scan velocity. This variation is accomplished by means of a non-linear transfer function in one or more ion optical elements. Such elements may be magnet poles or pole edges, or multipole lenses of various types including magnetic and electrostatic components.

Still another aspect of the invention provides a means of tilting the wafer chuck about a tilt axis inclined to the length of the arm, so disposed that the workpiece may be loaded in a horizontal plane and tilted to an arbitrary angle between horizontal and orthogonal to the direction of the ion beam. The inclination of this tilt axis relative to the plane of the scan and to the scan pivot axis is selected to combine convenience of horizontal loading with a desired range of wafer tilt angles relative to the beam.

Yet another aspect of the invention allows the above-described aspects to be utilized in the case where a suitable ribbon-shaped beam is unavailable, and instead, an ion beam of transverse dimensions smaller than the workpiece is available. This aspect provides a sliding seal mechanism with vertical linear bearings and scan actuator mounted in atmosphere, incorporating a plate from which the scan mechanisms described above may be mounted, through a slot in the vacuum wall on a cantilevered member, in such a manner that the entire scan mechanism may be scanned in a vertical direction through a distance exceeding the dimension of the workpiece, effective to scan the workpiece mechanically in a 2D raster pattern through the ion beam, thereby imparting a uniform dose of ions at a specified angle to a surface of the workpiece.

An additional aspect of the invention provides a means of rotating the chuck holding the workpiece about an axis perpendicular to the implanted surface of the workpiece. This may be actuated between passes of the wafer through the beam to fulfill two functions: (i) to change the orientation of the ion beam to the workpiece, for example to perform 'quad mode' tilted implants to the workpiece, and/or (ii) to rotate the workpiece 180 degrees after implanting half the total dose, so that any systematic dose non-uniformity due to errors in the required linear variation of current density is as at least partially cancelled.

BRIEF DESCRIPTION OF THE FIGURES

The present invention may be more easily understood and better appreciated when taken in conjunction with the accompanying drawing, in which.

DETAILED DESCRIPTION OF THE INVENTION

Figure 1:
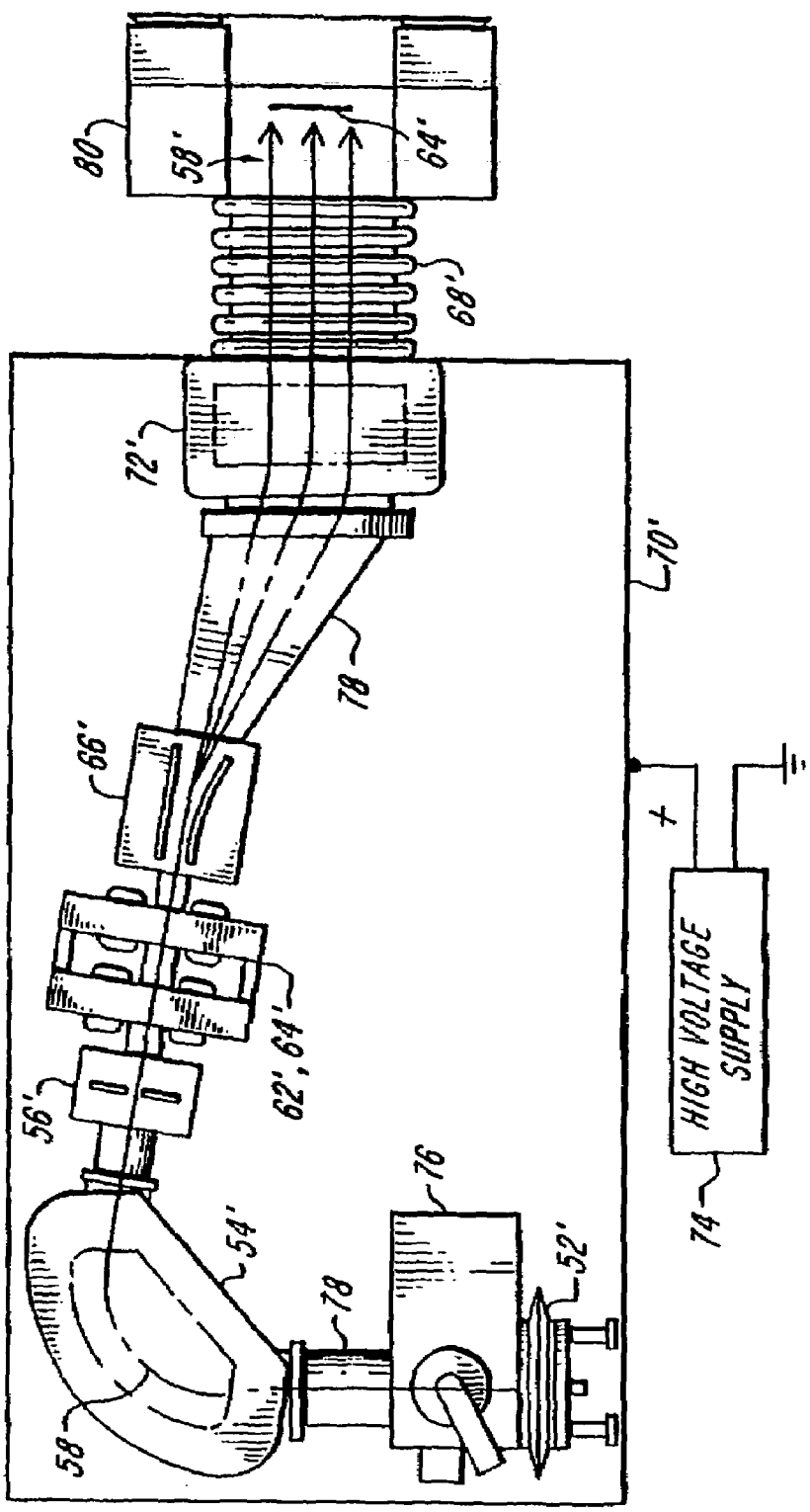
FIG. 1 (Prior Art) is an illustration of the hybrid serial ion implanter sold as the E220 by Varian Associates Inc.
Figure 2:
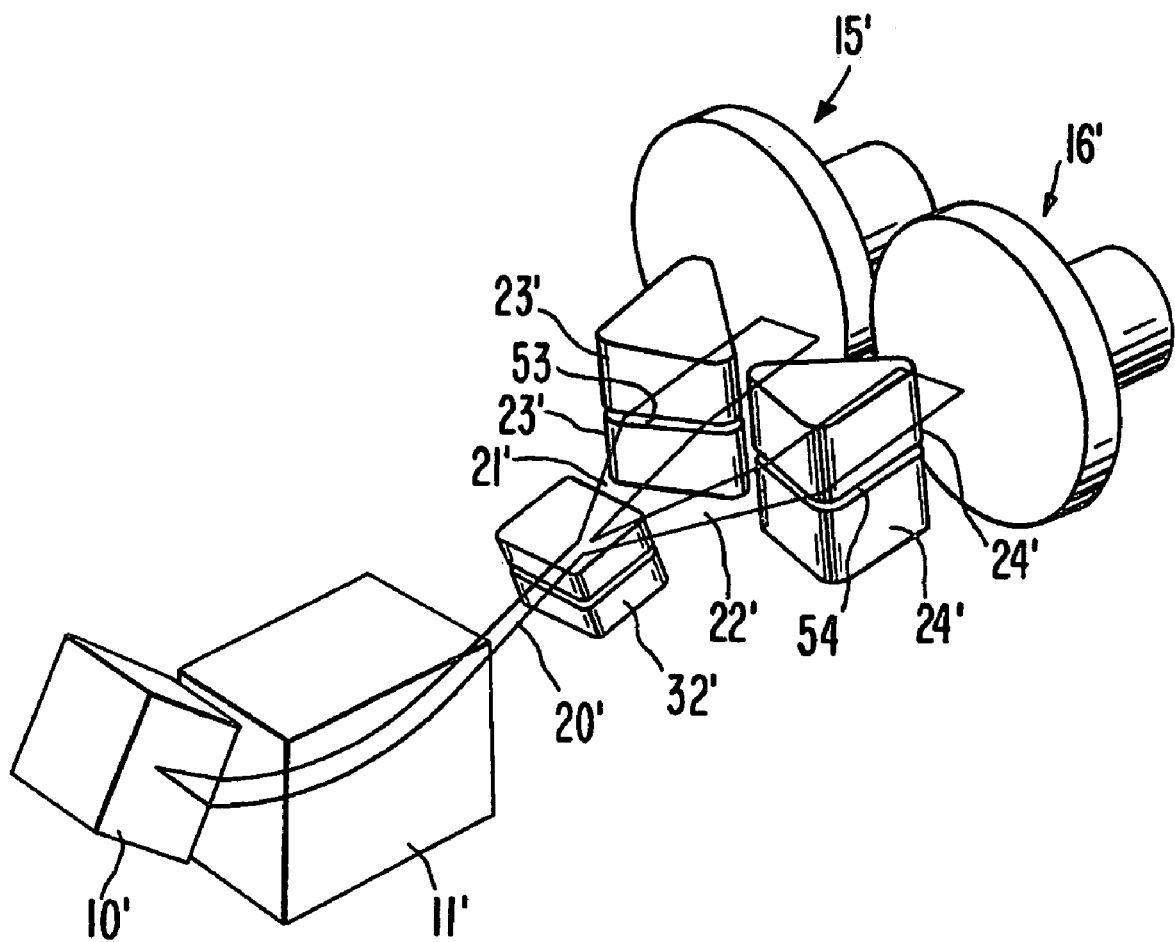
FIG. 2 (Prior Art) is an illustration of the hybrid batch ion implanter sold as the 120-10 by Varian Associates Inc.
Figure 3:
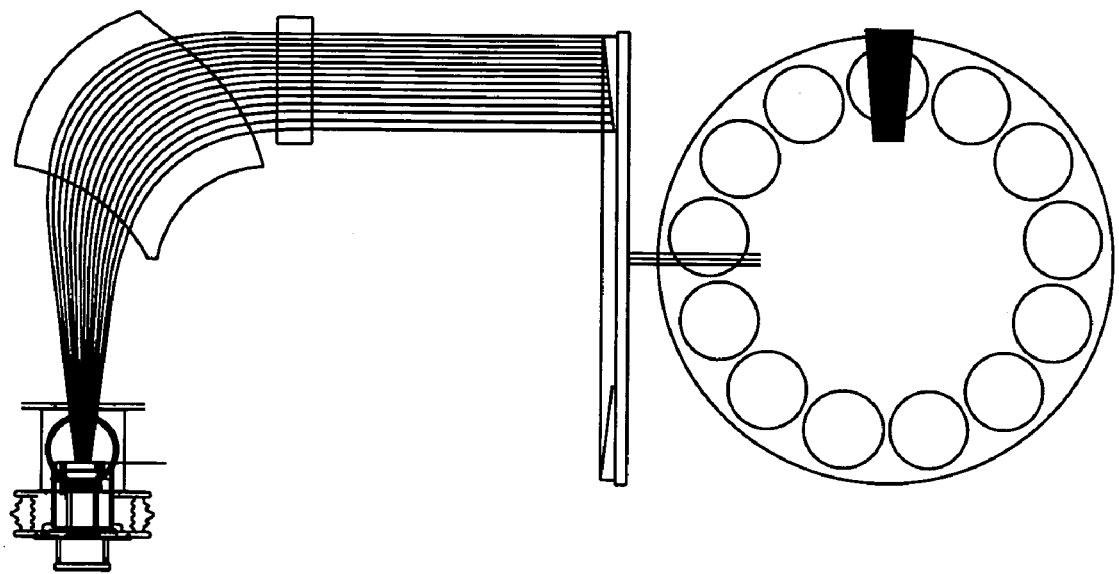
FIG. 3 (Prior Art) is an illustration of a proposed continuous ribbon-beam batch implanter for SOI manufacture.

I. The Goals and Purposes of the Present Invention

The present invention provides a system for scanning a workpiece such as a semiconductor wafer in a first dimension through an ion beam. The system of the present invention is designed to meet the following goals and purposes:

No variation of the tilt angle between beam and wafer surface during processing;

Control of the tilt angle between 0 and at least 45 degrees;

No variation in the twist angle (see FIG. 5b) during processing;

Eliminate linear vacuum feedthroughs; replace with rotary seals, and minimize the number of seals;

Place all actuators, motors, cables and bearings in atmosphere, outside the vacuum;

Accomplish the required motions with simple, reliable and low cost mechanisms; and Minimize the mass of moving parts so that the rapid deceleration and acceleration at the ends of the mechanical scan motion can be achieved with lower power motors and less mechanical stress.

Whereas these goals relate to scanning which is optimized for use with a ribbon beam, there are often circumstances where a ribbon beam is unavailable or insufficiently uniform, and uniform doping requires two-dimensional mechanical scanning. An additional goal, therefore, is to optionally provide a means of moving the entire scanning system meeting the above goals in a second direction orthogonal to its first direction so as to provide a capability for two-dimensional mechanical scanning.

In addition to these mechanical goals, it is deemed desired to present the wafer holder to a loading mechanism in a horizontal attitude, even though the wafer is scanned in a non-horizontal plane. Also, in the interests of ultra-pure processing, it may be desired to load and unload the wafer at a location screened from the ion beam, fully shadowing the wafer front surface from inadvertent exposure either to the ion beam or to any surface it may strike.

II. Definitions

In order to avoid ambiguity of language and to provide a clear and correct understanding of the present invention, a set of technical terms and proper definitions is provided below. These technical terms and proper definitions constitute the controlling terminology and language which properly describes the details of the present invention; and will be employed repeatedly and consistently hereinafter.

Ion beam: This term as used herein embraces any beam of charged particles, including electrons, positive or negative ions, molecules, clusters, or subatomic particles.

Ribbon beam: an ion beam having a cross section characterized by a long dimension and a short dimension, the long dimension being at least twice the short dimension, and usually at least five times the short dimension. The long dimension is usually larger than a dimension of the face of the workpiece to be processed with the beam Scanned Ribbon Beam: An ion beam whose unscanned cross section is near circular, elliptical, or rectangular with low aspect ratio, but which is scanned within a plane, so that the time-averaged envelope of the scanned beam has a cross section corresponding to the definition of a Ribbon Beam. The scan waveform determines the time averaged uniformity of the beam in the plane.

Continuous ribbon beam: A beam whose unscanned cross section corresponds to the definition of a ribbon beam, and in which the current at any point is uninterrupted for at least the time required to process one workpiece with the beam.

Parallel Ribbon Beam: an ion beam in which all trajectories are substantially parallel, with a major and minor transverse axis. The major axis typically exceeds in length one dimension of the workpiece which the beam is used to treat.

x, y, and z coordinates: As illustrated by FIG. 5, the z coordinate is the intended direction of travel of the ion beam. The x-coordinate is aligned with the larger cross sectional dimension of the intended beam envelope, and the y-coordinate with the smaller dimension. The origin lies at a point along the centroid of the ribbon beam. It follows that the long dimension of the ribbon beam (equivalent to the scan plane for a scanned ribbon beam) lies in the plane y=0.

Tilt angle: As illustrated by FIG. 5b, the angle between the direction of the incident ion beam and the normal to the surface being implanted. This angle is labeled as reference numeral 160 in FIG. 5b.

Twist angle: As illustrated by FIG. 5b, the angle in the frame of the implanted workpiece between a normal to the axis of the tilt angle and a reference axis sometimes denoted by a notch (reference numeral 171) on the workpiece. This angle is labeled as reference numeral 170 in FIG. 5b

III. The Subject Matter of the Present Invention as a Whole

It will be also appreciated that the subject matter of this invention is applicable to implantation with ribbon ion beams of several types, parallel and non-parallel, continuous or scanned, and that variations of orientation of the system in space are possible. No loss of generality is intended by the use of the words "scanned", "vertical", "horizontal", "pendulum" in particular instances.

Also, to simplify language and improve the intelligibility of the particular aspects of the invention, one should assume that, within the following descriptions, the radial scan arm lies in a generally vertical orientation when the workpiece is in the ion beam. However the entire invention may, for convenience, be mounted in any orientation; and no loss of generality is intended by using this form of language.

In addition, in the following embodiments, the invention will be described with specific reference to a parallel ribbon beam. However, it will be noted and appreciated that the invention can be employed equally well with continuous ribbon beams and with scanned ribbon beams; and the recited details of the description is not intended in any way to limit the application of the present invention to any one type of beam.

Figure 5A:
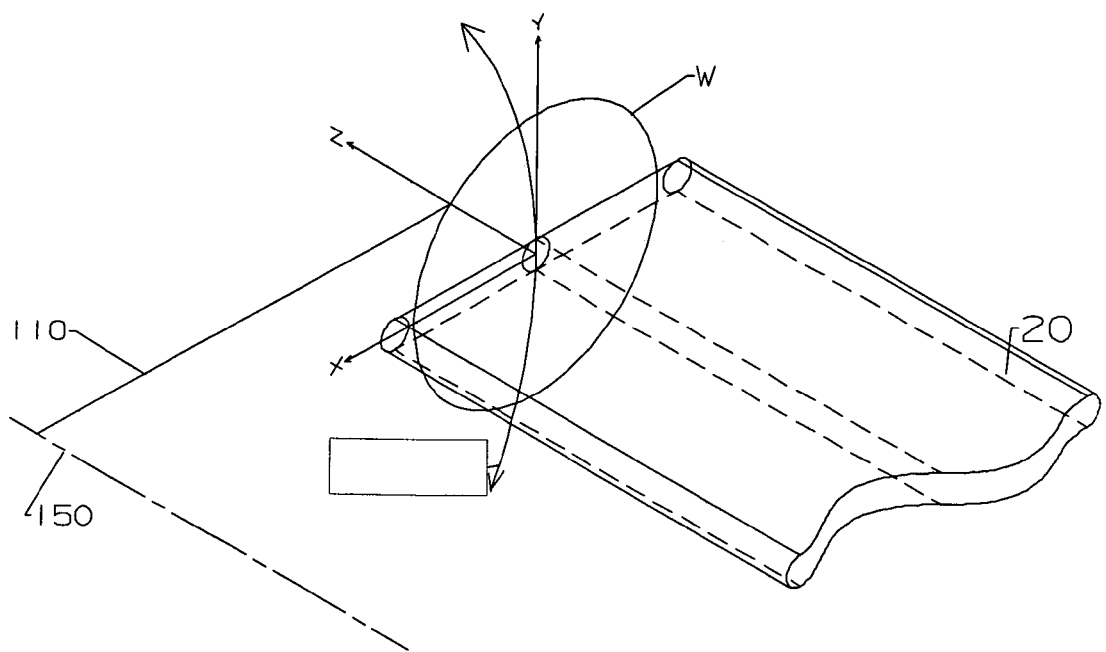
FIG. 5a is an illustration of the Cartesian coordinate system centered on the beam.
Figure 5B:
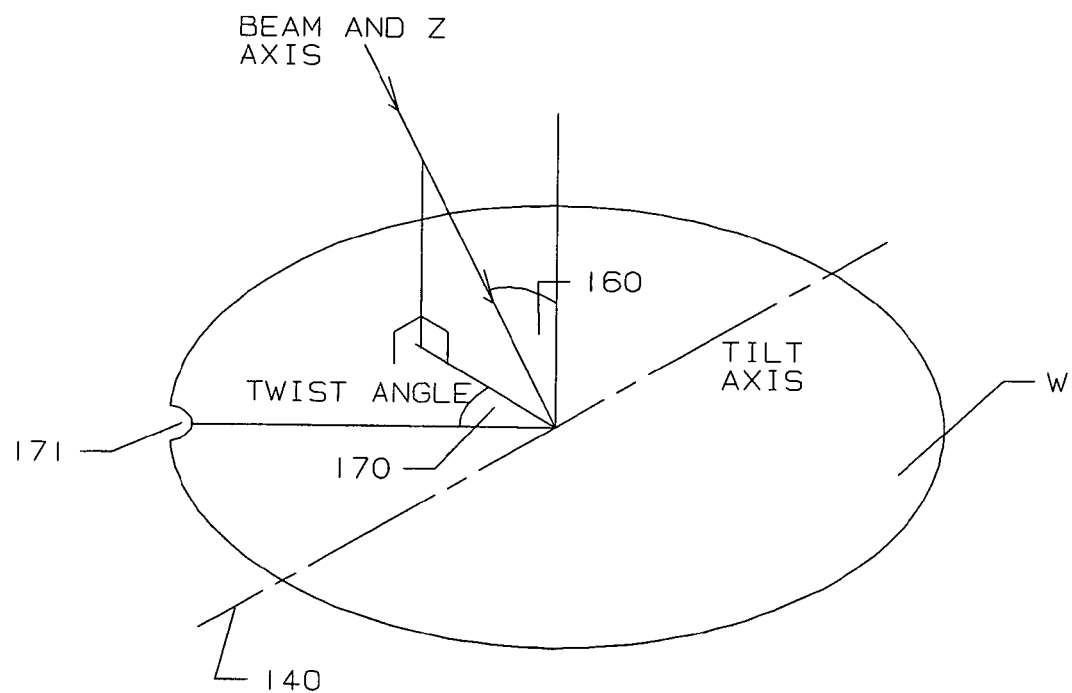
FIG. 5b is an illustration of the polar coordinates centered on a wafer being implanted, referred to by the words tilt, and twist (also orient or azimuth). The origin is at wafer center, and the twist angle is measured clockwise from line from center to alignment mark on wafer.

A. An Illustrative Arrangement:

As shown by FIGS. 5a and 5b, a parallel ribbon beam is traveling in the z-direction, and the major transverse axis of the beam lies in the plane y=0. A workpiece, typically a silicon wafer, is passed through the beam in the y direction by means of an radial scan arm 110 attached to a pivot (the "arm pivot"). The arm pivot is located in or near the plane y=0, and its axis 150 lies parallel to the z-axis. A planar workpiece such as a silicon wafer is held on a platen at the opposite end of the arm. The envelope of the ribbon beam is slightly wider in the x-direction than the diameter of the wafer, so that the entire surface of the wafer presented to the beam is implanted.

The dose rate (in ions per sq. cm) at the surface of the wafer is proportional to the ion beam current, and to the cosine of the angle between the z-axis (the beam direction), and to the normal to the wafer surface. The dose at each point on the workpiece is inversely proportional to the velocity of that point on the surface of the wafer imparted by the radial motion of the arm; and the velocity is proportional to the distance of each point from the scan pivot axis. For a scanned beam it is also inversely proportional to the velocity with which the beam is scanned. For a continuous ribbon beam it is proportional to the local current density.

The current density of the ribbon ion beam 20 is preferably made to vary in proportion to the distance from the pivot axis. The use of shaped magnet poles can produce a suitable variation (and is described in detail below for a scanned beam), but essentially the same method may equally be used on a continuous ribbon ion beam. Curved magnet poles superimpose sextupole and possibly higher-order magnetic field components on a dipole magnetic field. Any form of sextupole may be used to generate the required linear variation of current density, but two sextupoles in combination will be required to maintain beam parallelism at the same time.

Figure 4:
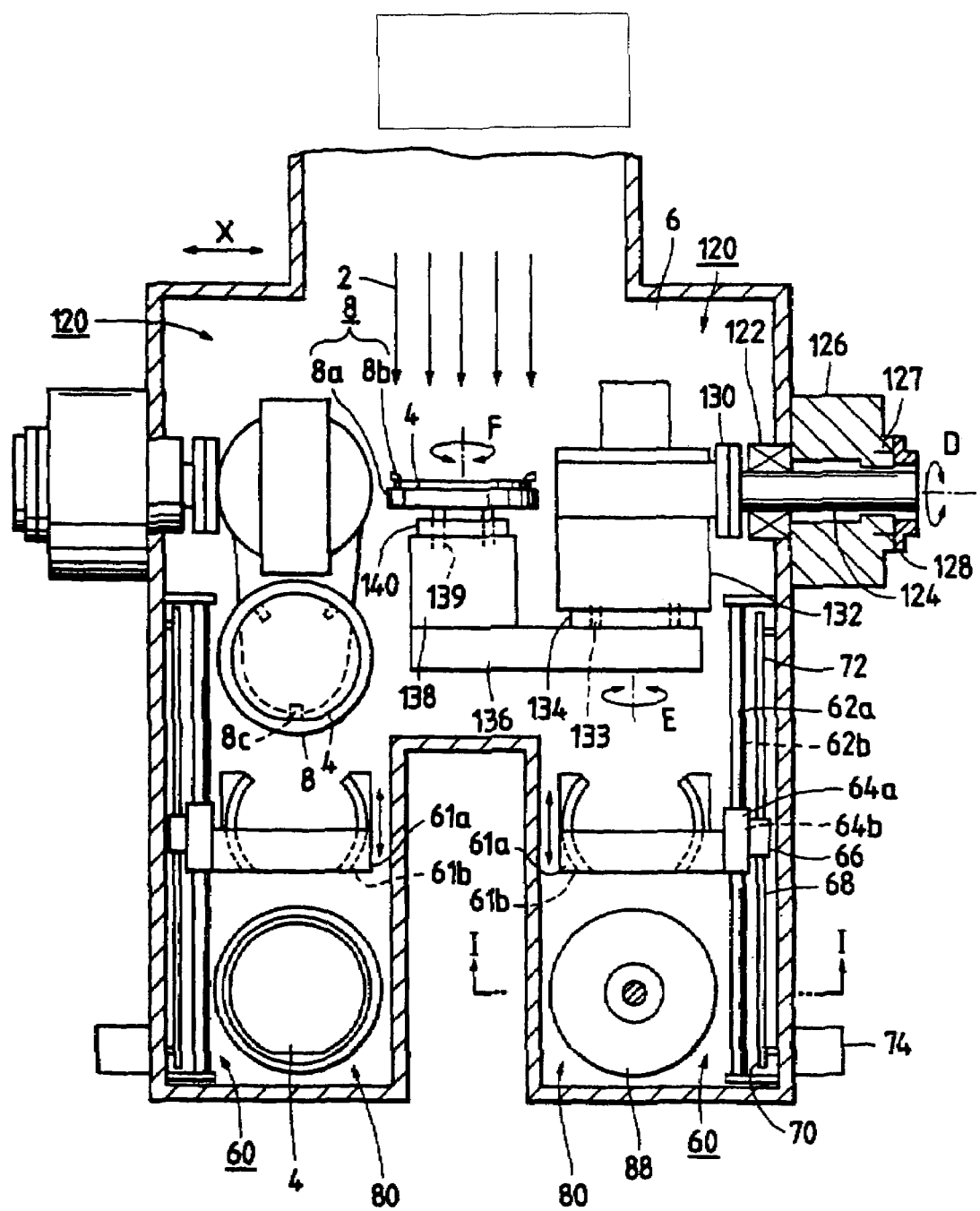
FIG. 4 (Prior Art) is an illustration of a more complex radial arm scan apparatus manufactured by Nissin Ion Systems.

It is a major point of difference and distinction between the present invention and that of Nogami shown illustrated by Prior Art FIG. 4 that the present invention requires the beam to be non-uniform, preferably to be linearly non-uniform along its major dimension. In contrast, the prior art Nogami format and structure requires the ion beam to be uniform along this dimension.

Angle Variation

The angle of incidence of the centroid of the ion beam on the wafer surface is characterized by two angles: the 'Tilt', which is the angle 160 in FIG. 5b, lying between the normal to the wafer and the z-axis (the beam direction); and the 'Twist' (azimuth), which is the angle 170 in FIG. 5B and is defined in the frame of reference of the wafer surface, where the 0 degree reference is usually denoted by a notch 171 in FIG. 5b, or else a flat, laser scribe, or other peripheral mark. It is desired that both the tilt and twist angles remain constant across the entire area implanted. Because the scan pivot axis is parallel to the z-axis, provided that the beam centroid is always traveling parallel to the z-axis as intended, rotation of the arm about the arm pivot does not change either the tilt or twist angle.

The tilt angle can be varied from 0 degrees by providing a second pivot axis on the arm. This second pivot axis (hereafter referred to as the "tilt pivot") is shown as tilt pivot 140 in FIGS. 6, 7, 8 and 10 respectively and must be inclined to the arm pivot axis—but the particular angle does not have to be 90 degrees. The tilt angle for an implant can be controlled by means of the tilt pivot. The twist angle can be controlled by pre-orienting the wafer before loading onto the platen, or optionally by providing a means of rotating the wafer platen about an axis normal to the center of the wafer.

Careful consideration will show that as the arm 110 is rotated about the scan pivot axis, to pass the wafer through the beam, with the wafer at a non-zero—but constant—tilt angle, there is no variation in the tilt or twist angles at any point on the plane surface of the wafer. This condition is well understood by those knowledgeable in the field.

This condition, however, could be compromised by any of the following conditions:
   bowing or distortion of the wafer;
   imperfections in the focusing dipole magnet used for generation of the parallel scanned beam;
   misalignment between the pivot axis and the direction of the beam centroid (not only does this cause a static error in the tilt angle, but the twist angle in the wafer frame varies as the arm is rotated about its pivot axis).

In some arrangements, it is desirable to deliberately change the twist angle during the course of the implant without unloading the wafer. The desired twist angle change may be continuous or stepwise (e.g. the implant may be divided into four steps with 90 degrees twist angle change between each step). The twist angle change may be accomplished by providing an additional mechanism within the platen which allows the wafer to be rotated about an axis through its center and normal to its surface. Alternatively it may be accomplished by a second tilt pivot, whose axis is normal to the first. Use of either of these additional mechanisms is encompassed within the scope of the invention.

Orientation

The orientation of the Cartesian coordinate system of FIG. 5a in space is beam-centered. It is immaterial to the forgoing discussion whether the beam is traveling horizontally, vertically, uphill or downhill. It is also immaterial whether the scan plane is horizontal, vertical, or at some intermediate angle. The only action requiring a specific orientation to the horizontal is that of loading and unloading the wafer. Preferred methods of wafer loading are in the horizontal plane (where it is possible to avoid contact with the edges of the wafer) or in a vertical plane (which requires edge-gripping of the wafer). Decisions about which is preferable relate to the tendency of any contact to generate particles which can contaminate the ultra-clean front surface of the wafer. The invention can be employed with any orientation.

The relationship between the tilt pivot axis and the radial direction on the arm will in practice be determined by the orientation of the beam in space and the requirement that the tilt pivot axis be capable of tilting the platen into the desired plane for loading and unloading the wafer. This point will be clarified by considering specific preferred embodiments, in each of which the load plane is horizontal. Means of implementing the invention in other orientations will be apparent to those skilled in the art of transferring semiconductor wafers between process stations in vacuum, and these are within the scope of the invention.

Figure 6:
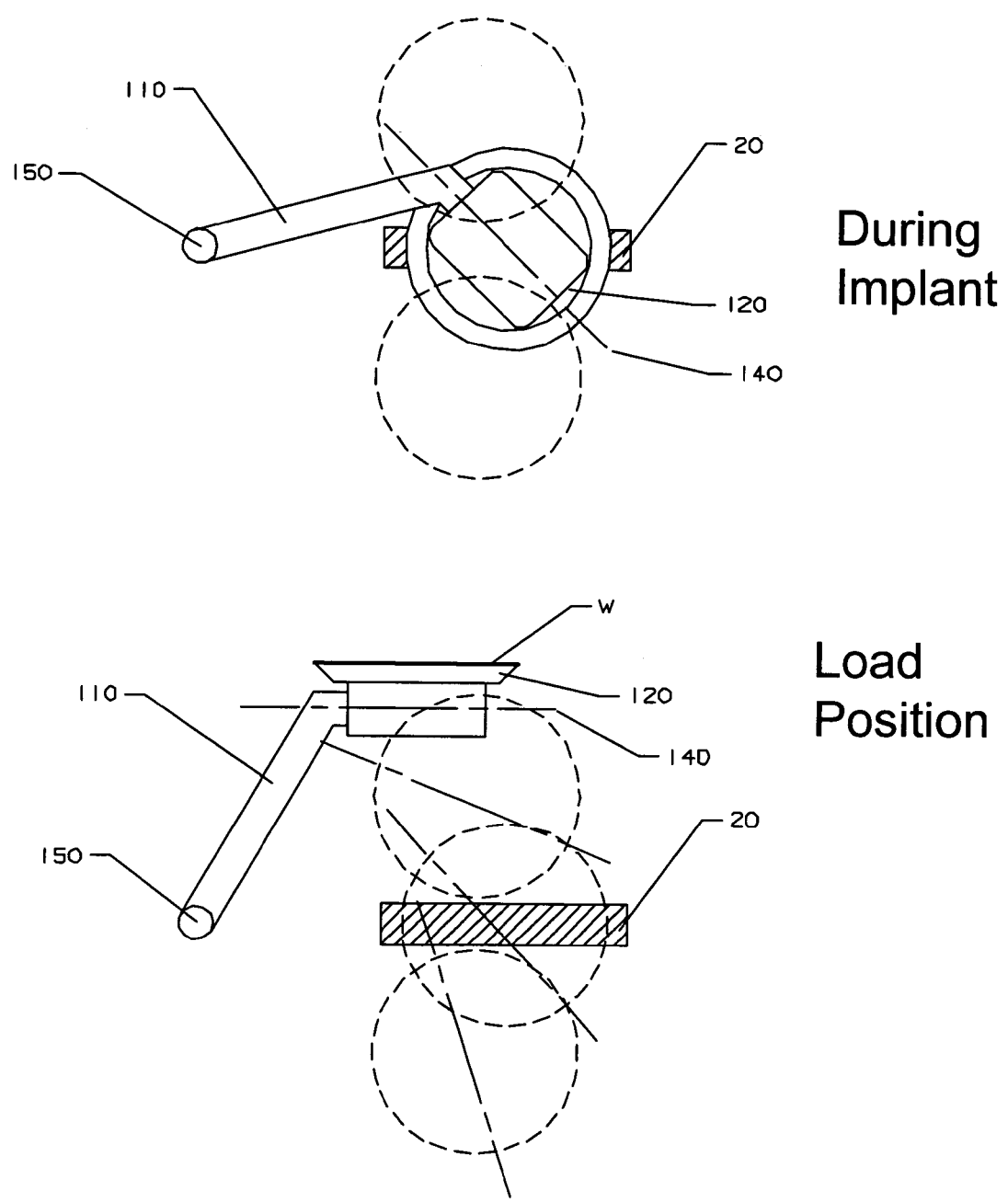
FIG. 6 is an illustration of a simple embodiment of the present invention's radial scan arm for use with a ribbon beam traveling horizontally with its major transverse axis horizontal.

B. A First Preferred Embodiment:

In the first embodiment illustrated by FIG. 6, the ribbon beam 20 is traveling horizontally and its long dimension is in the horizontal plane. This means that the x and z axes are horizontal and the y-axis is vertical. The workpieces to be implanted are 300 mm silicon wafers. The radial scan arm 110 is 450 mm long, and its pivot lies in the plane y=0. The scan pivot axis is of course aligned with the beam z-axis, and the alignment may be confirmed [by methods described in U.S. patent application Ser. No. 10/807,772, filed Mar. 24, 2004, or by other methods].

The tilt pivot axis 140 lies in a plane inclined to the z-axis, and does not intersect the scan pivot axis. Its orientation is defined as follows: in order for the edge of the wafer to clear the ion beam, the arm must pivot through an angle whose sine exceeds (150 mm/450 mm), i.e. by +/−19.5 degrees. To allow for the finite y-extent of the beam (probably +/−30 mm) the arm would have to be rotated through an angle of +/−25 degrees.

To allow for some mechanical clearances, one can assume that the radial scan arm in practice can pivot through +/−30 degrees. In this first embodiment, it was purposely chosen that the arm is rotated upward at 30 degrees for loading and unloading the wafer. It was also intentionally selected that the orientation of the tilt pivot axis 140 be horizontal with the arm 110 in this position.

It should be noted that in FIG. 6, when the wafer surface is tilted to be normal to the z-axis, and the wafer center coincides with the z-axis, there is no requirement that the pivot arm be horizontal. The physical arm alignment can depend on the design of the pivot mechanism, provided that the relationship between the pivots is as described herein. In this first embodiment, the arm is inclined about 10 degrees uphill so that there is an elbow of 40 degrees in the arm as it enters the tilt pivot mechanism.

Structural Design

Figure 9A:
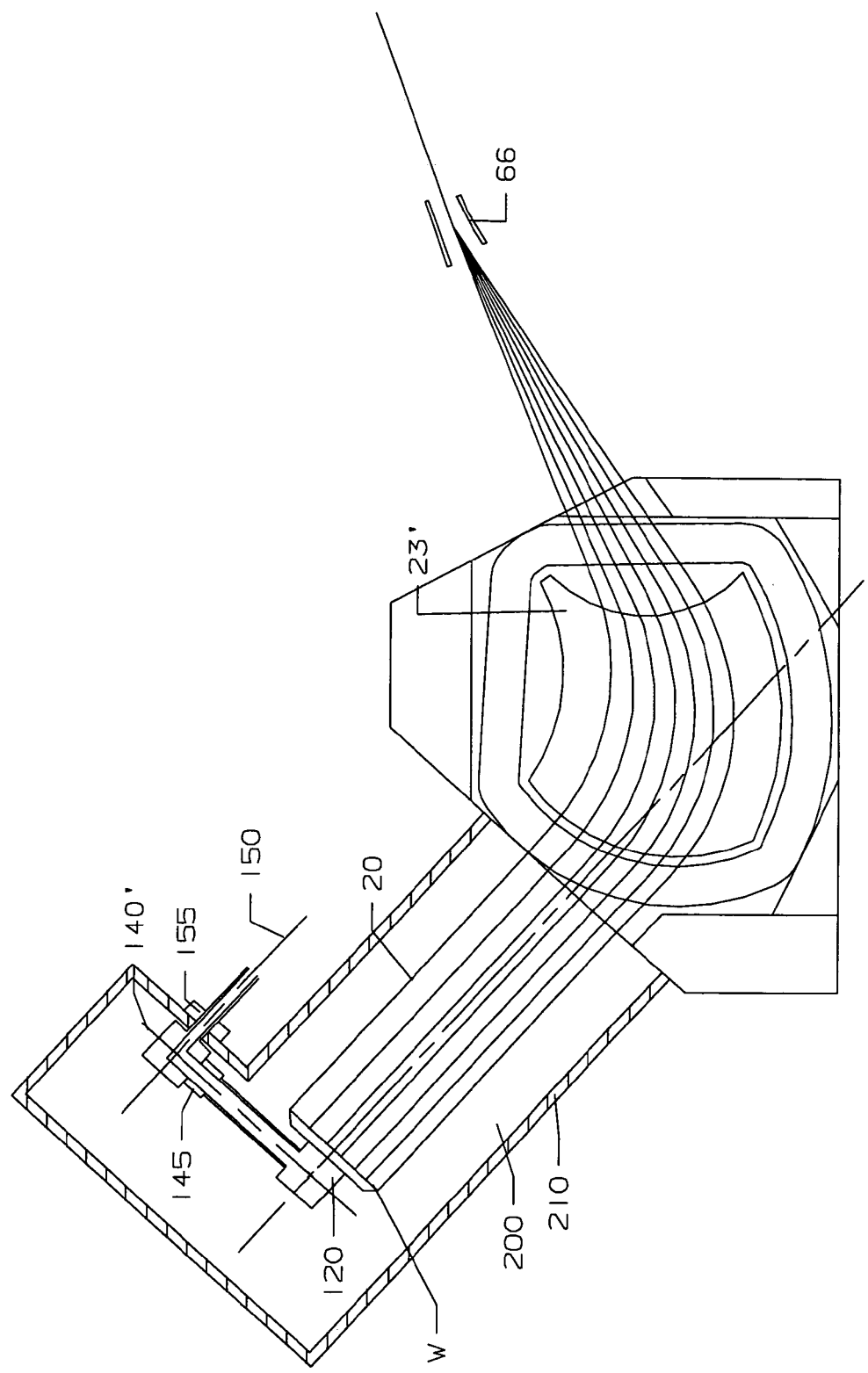
FIG. 9a is an illustrated view of the beam scan arrangement for the present invention, with the radial arm pivot to the outside of the beam path.

As shown by FIG. 9a, the radial scan arm is preferably hollow, and the tilt pivot incorporates a vacuum seal 145. The scan pivot passes through a vacuum seal 155, so that although the platen is moving within the vacuum environment of the ion beam, the pivot bearings (not shown) may be located outside the vacuum wall in normal atmosphere. Additionally there is normal atmospheric pressure within the hollow arm and in the space housing the tilt pivot bearings. The only sliding vacuum seals are rotary seals, and all bearings and actuators can be housed in normal atmosphere, where they may be cooled more easily and use conventional lubricants without compromising the vacuum.

This structural design accomplishes the mechanical goals outlined above, using a minimum of motions, placing bearings outside the vacuum environment, and using only rotary vacuum seals.

The wafer is loaded by a robot arm (not shown) employing primarily backside contact close to the wafer edges, but with a shallow well ensuring that the wafer cannot slide off the robot arm during normal motion. It is held to the platen by electrostatic clamping. It is pre-oriented so that the wafer notch, flat, or scribe is aligned at a specified angle relative to the tilt pivot axis, whose orientation in the load plane is simply normal to the z-axis in the horizontal plane. After loading a wafer, the platen is rotated about the tilt pivot axis through an angle of (90 degrees +/− the desired tilt angle) so that the wafer is facing the beam, and the implant is performed by rotating the arm about its pivot axis at a uniform angular velocity though the beam. Acceleration and deceleration of the arm are carried out using s-curve motion, to minimize jerk and avoid unwanted oscillations in the scan velocity. The design also meets the goal of minimizing inertia in the system, allowing for rapid smooth turnarounds and good precision in placement.

Note also that in this first embodiment, the wafer is loaded and unloaded in a plane well above the plane of the ion beam. Particles generated by the beam or by surfaces it may strike are thereby prevented from falling on to the wafer and contaminating it while it is in the horizontal load position. Also note that only a small angular rotation of the arm is required to reach the load position from the upper extreme of the mechanical scan (when the lower edge of the wafer clears the ion beam). This is advantageous to minimize the time for loading and unloading the wafer, thereby maximizing the efficiency of the implantation process.

Figure 7A:
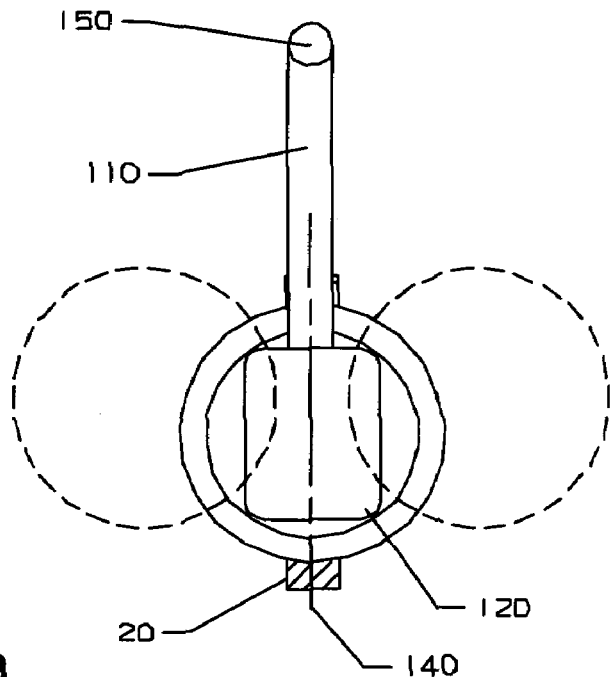
FIGS. 7a and 7b are illustrations of a simple embodiment of the present invention's radial scan arm for use with a ribbon beam with its major transverse axis vertical, in which the scan pivot axis is located above the beam.
Figure 7B:
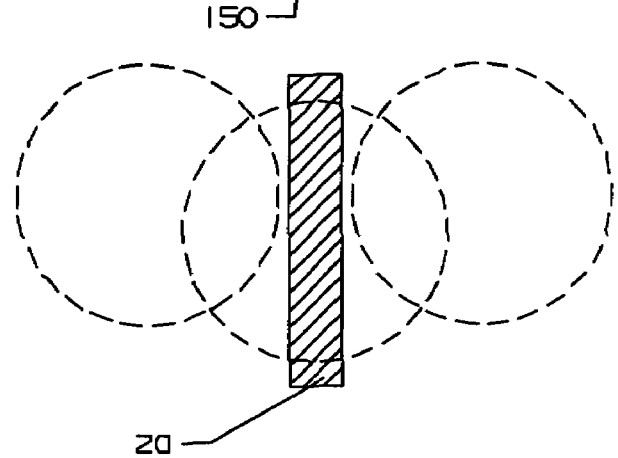

C. A Second Preferred Embodiment:

As shown by FIG. 7, in this second embodiment the ribbon beam is also traveling horizontally, but its long dimension is in the vertical plane. This means that the y and z axes are horizontal, and the x-axis is vertical. The arm is 450 mm long, and its pivot lies in the plane y=0, aligned with the beam z-axis. The tilt pivot axis in this case is aligned with the radial arm. From the mid-point of the wafer scan, the load/unload position is reached by rotating the radial arm by 90 degrees so that its length is parallel to the y-axis, and then rotating 90 degrees about the tilt pivot axis so that the wafer surface is horizontal. These rotations have been defined sequentially, but in practice they occur simultaneously to save time.

The arm pivot axis may be located either above or below the beam. However, a location above the beam (as shown in FIG. 7) is preferable so that particles generated by the beam, or by surfaces it may strike, are prevented from falling on to the wafer.

Figure 8:
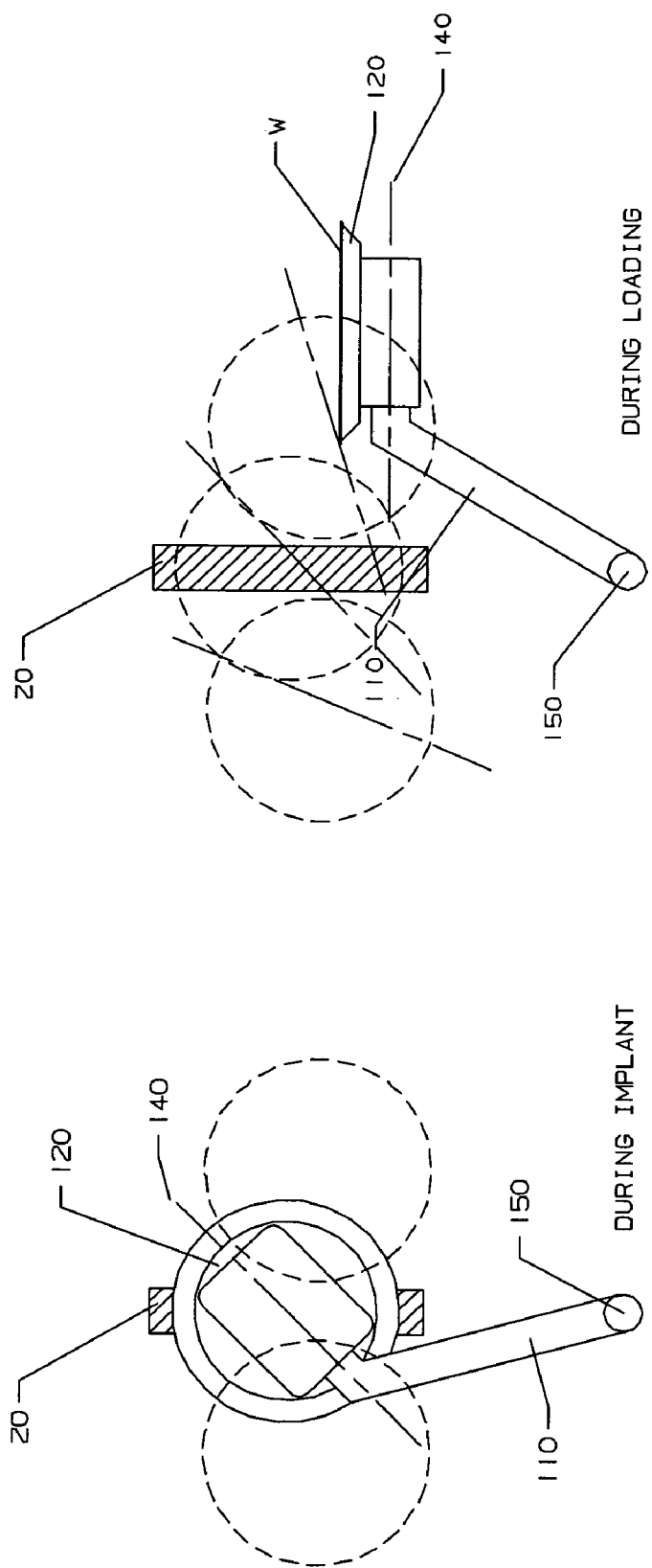
FIG. 8. is an illustration of another embodiment of the present invention's radial scan arm for use with a ribbon beam with its major transverse axis vertical, in which the scan pivot axis is located below the beam.

D. A Third Preferred Embodiment:

FIG. 8 illustrates the use of the scan arm arranged as an inverted pendulum. The ion beam in this case has its long dimension vertical, and is a continuous ribbon beam which is traveling horizontally. The current density in the ion beam increases linearly from bottom to top. This is accomplished by using the apparatus and methods described in a co-pending patent application by Nicholas R. White entitled "High Aspect Ratio, High Mass Resolution Analyzer Magnet for Ribbon Ion Beams".

Figure 11:
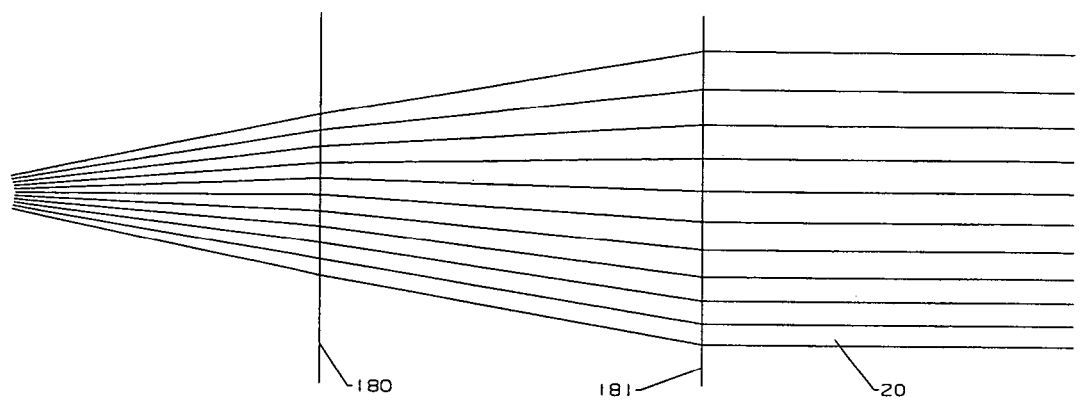
FIG. 11 shows an ion beam with arbitrary initial divergence and uniformity profile, passing through two lenses with sextupole components and being rendered essentially parallel while exhibiting a strong variation in current density from top to bottom. (Each trajectory conventionally represents an equal quantity of current, and the variation in spacing is inversely proportional to the local current density. The spacing varies by a factor of about 1.8 from bottom to top).

An increase in current density can also be accomplished by any of several other means. The principle of the methods used is to provide two (or more) regions of focusing, each containing a non-linear focusing element. The sextupole field component of these focusing regions is instrumental in modifying the current density profile. Copending patent applications by Nicholas R. White describe several embodiments of such systems. The operation of such systems is illustrated in FIG. 11, where an ion beam (which may or may not be divergent, but is shown as diverging) passes in succession through two lenses. The sextupole component of the first lens 180 is adjusted so that at the principal plane of the second lens 181 the current density has been modified to a desired profile. Lens 181 is adjusted so as to render the trajectories parallel, and this preserves the desired current density profile downstream of lens 181. In co-pending U.S. patent application Ser. Nos. 10/807,770 and 10/807,772 (expressly incorporated herein by reference) a variety of methods for construction and operation of suitable multipole lenses are described.

As shown in FIG. 8, a robot (not shown) loads and unloads wafers from an electrostatic chuck 120, while the chuck is tilted to a horizontal position by tilting about axis 140. After clamping each wafer, the chuck is rotated about axis 140 to a desired tilt angle for implant. The chuck is mounted via a pivot and actuator so that it may be rotated about the normal to the wafer center, and this may be used to vary the twist angle (shown as angle 170 in FIG. 5*b*). Thus no pre-orientation mechanism is required; instead a camera may be employed to observe the wafer as it is loaded onto the chuck, and the chuck is then rotated to the required angle prior to commencing the implant.

It is challenging to control the uniformity of continuous ribbon beams at energies below 1 keV and high current. For this reason, it may be judged more productive to re-focus the beam to a relatively small spot and pass the wafer through this beam in a 2-dimensional pattern to accomplish uniform dosing.

An additional mechanism may be used in conjunction with this or other embodiments of the invention as a means of providing a two-dimensional mechanical scan. To meet this end, this third embodiment may be mounted on a movable slide effective to move the entire radial arm scan assembly in the vertical direction. Accordingly, it may now be used to mechanically scan the wafer in two orthogonal directions; and this is very useful under certain conditions (e.g., very low energies below 1 keV and high currents of several mA) where a sufficiently uniform ribbon beam is hard to obtain. In this case, a beam 21 which is approximately circular or rectangular, as illustrated in FIG. 10, can be used.

Also, the low energy beam can be manipulated by a multipole lens to reduce its size considerably. FIG. 10 illustrates the structure of this arrangement. As seen therein, the sliding seal may be constructed using nested seals of delrin or similar plastic, with the intervening space differentially pumped. Such a construction has been known in this industry since about 1980; and was incorporated into the NV-10 implanter, an implanter commercially sold later by Eaton Corporation, as described by U.S. Pat. No. 4,234,797.

Figure 10:
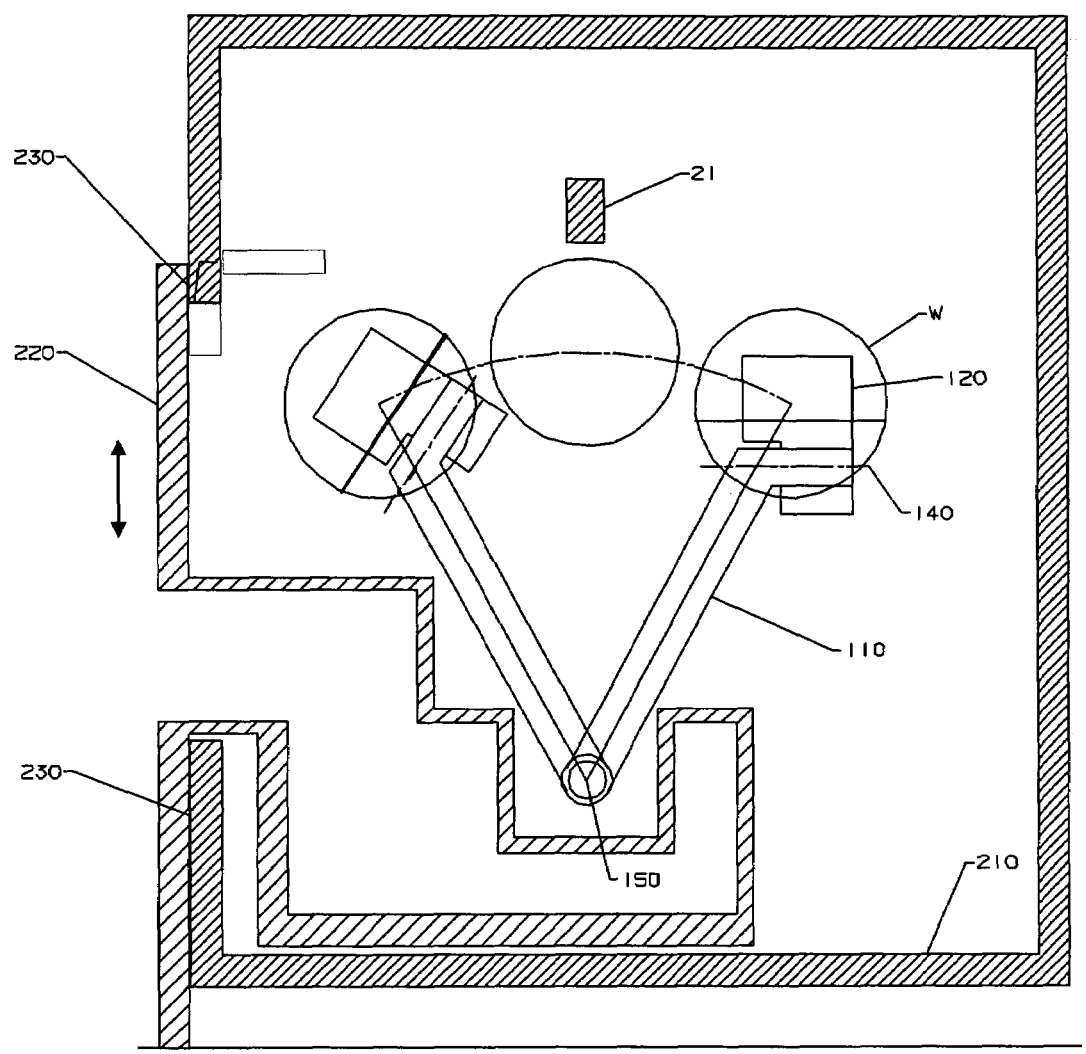
FIG. 10 illustrates the use of a radial scan arm to economically accomplish 2-dimensional mechanical scanning, for use with a fixed non-ribbon ion beam.

Within the structural arrangement of FIG. 10, the travel of the sliding seal needs to be substantially greater than 300 mm, and 450 mm would allow space for overscanning a relatively large ion beam and allowing additional space for acceleration and deceleration. This requires greater than 450 mm of overlap in the sliding seal area on each side of the slot in vacuum wall 210. The moving assembly 220 can be driven by a ball screw and motor (not shown) and be mounted on conventional commercially available ball slides. The mechanism would be used with a relatively low duty cycle with low velocity and accelerations, and therefore could meet the reliability requirements.

Figure 9B:
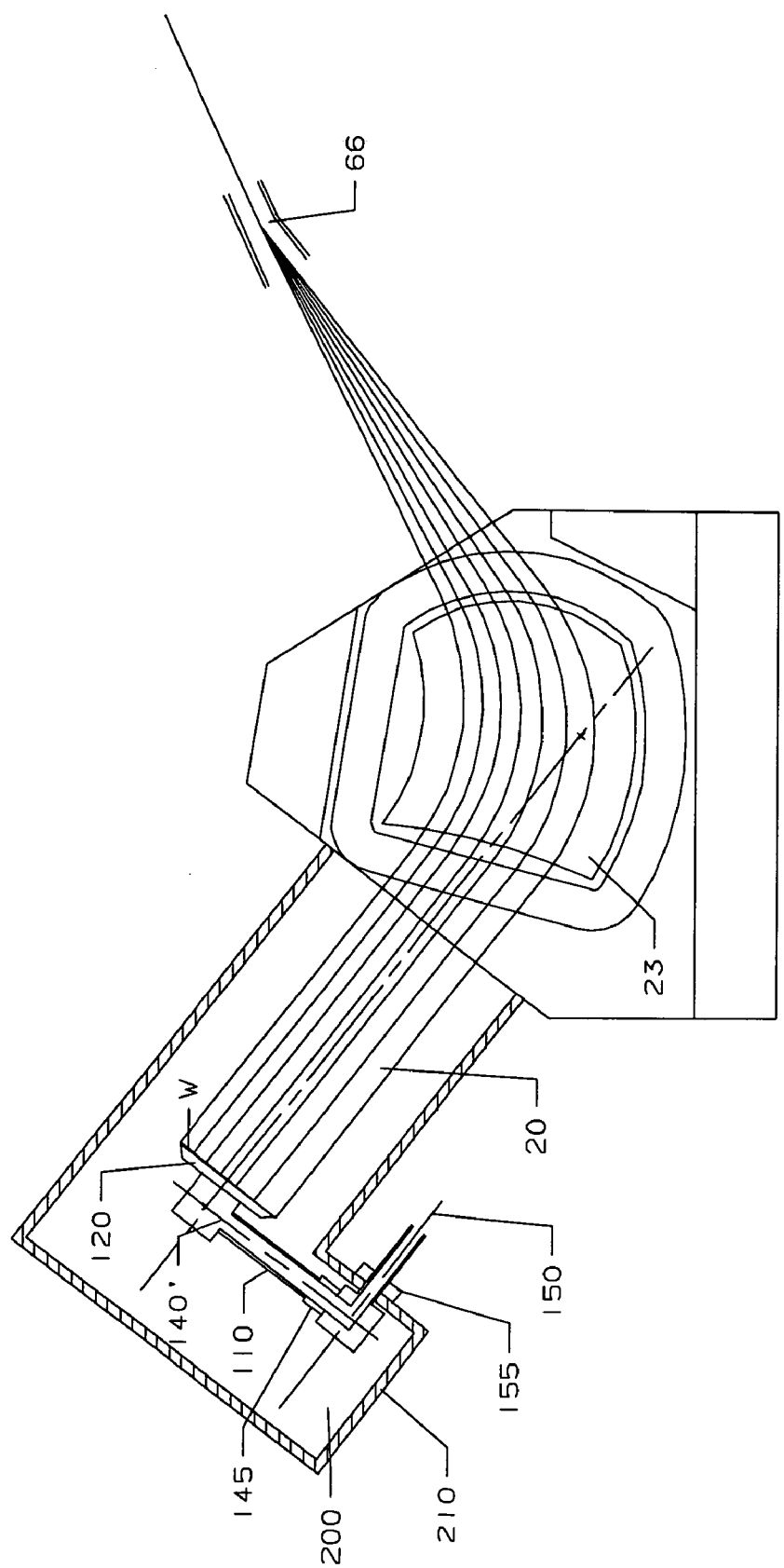
FIG. 9b is an illustrated view of the beam scan arrangement for the present invention, with the radial arm pivot to the inside of the beam path.

A Fourth Preferred Embodiment:

In this fourth preferred embodiment (as shown in FIGS. 9*a* and 9*b*), the ribbon beam is traveling upwards at an angle of about 40 degrees to the horizontal, and its long dimension lies in the vertical plane. The y axis is horizontal, and the arm pivot axis lies in the vertical x-z plane, parallel to the z-direction. The tilt pivot axis is aligned with the radial arm. From the mid-point of the wafer scan, the load/unload position is reached by rotating the radial arm until the tilt pivot axis lies in a horizontal plane, and then rotating about the tilt pivot axis until the wafer surface is horizontal. Note that these rotations have been defined sequentially—but in practice and operation, they occur simultaneously to save time.

Note also that, in this fourth embodiment, the wafer is implanted with its front surface facing downward, which is advantageous in preventing particles generated by the beam or by surfaces it may strike from falling on to the wafer during implantation.

FIG. 9*a* illustrates the case where the radial arm pivot is located to the outside of the beam path through the focusing magnet 23; and FIG. 9*b* illustrates the case where the radial arm pivot is located to the inside of the beam path through the focusing magnet. Thus, in the case of a scanned ribbon beam (as illustrated in FIGS. 9*a* and 9*b*) and as a result of the different pivot position, the required 1/R beam scan velocity distribution is markedly different for these two cases.

It would be possible to generate the required 1/R distributions using appropriate scan waveforms from the voltage generator driving the scanner plates 66. However, the voltage waveform is usually used for fine tuning the implant uniformity, and relying on this method to also provide a constant 1/R variation increases the cost and power dissipation of the voltage supply, and increases the time required to set up the required waveform for each implant. It is preferable to design the focusing magnet 23 so that its magnetic field shape creates a 1/R scan velocity distribution which is appropriate for all implants. The required magnetic field shape is different for the two arm pivot positions, as illustrated by the different magnet pole shapes shown in FIGS. 9a and 9b. In the case of a continuous ribbon beam, the same magnet pole shapes generate a desired linear variation in current density, proportional to the radial position.

Alternatively, if a source of a uniformly diverging continuous ribbon beam is substituted for the scanner in FIGS. 9a and b, the magnets perform an analogous function to cause a desirable linear variation in current density, allowing uniform implants to be achieved.

Finally, residual systematic linear non-uniformity arising from imperfections in the magnet or intrinsic non-uniformities in the beam can be reduced or eliminated by rotating the workpiece 180 degrees, midway through the implantation process. A motorized rotating chuck is provided to accomplish this.

IV. The Operative Functions and Major Advantages of the Present Invention

The present invention fulfills the following operative functions and provides major advantages and benefits. Among them are the following:

1. The present invention scans a wafer through a beam in an arc-shaped path.
2. The invention provides a means of adjusting the angle between the beam and the normal to the surface of the wafer between 0 degrees and angles considerably in excess of 45 degrees.
3. The invention eliminates scan-dependent variation in the incident angle of the beam across the plane surface of the wafer.
4. The invention provides a convenient means of tilting the wafer holder to a horizontal position to permit loading and unloading of the wafer, preferably in a location shielded from and above the ion beam location.
5. The invention corrects the ribbon beam intensity to compensate for the radial variation of the wafer scan velocity with distance from the center of the arc-shaped path, thereby providing a uniform dose to all points on the surface of the wafer.
6. The invention provides for a relatively short arm and low mass moving parts, so that rapid deceleration and acceleration can be achieved with lower power motors and less mechanical stress.
7. The invention allows use of standard, compact, low cost rotating mechanisms, in which there are no sliding seals or expensive linear drives, and in which all bearings are located outside the vacuum, thereby reducing cost, improving reliability and avoiding contamination of the wafer.

The present invention is not to be restricted in form nor limited in scope except by the claims appended hereto.

What we claim is:

1. An apparatus for ion implantation of planar surface workpieces, said apparatus comprising:
   means for generating an ion beam of desired species and energy;
   means for collimating said ion beam to form a parallel ribbon beam, said beam traveling parallel to a longitudinal axis, and having a long dimension along a major transverse axis and a short dimension along a minor transverse axis;
   an arm mounted on a first pivot, whose pivot axis is adjacent to said beam, is parallel to said longitudinal axis, and is located in or close to the plane containing said longitudinal axis and said major transverse axis;
   means for controlling the current density of said parallel ribbon beam and rendering said beam proportional to the distance from the axis of said first pivot;
   a chuck for a workpiece to be implanted, said chuck being attached to said arm by a second pivot whose axis is inclined to said first pivot, wherein the workpiece to be implanted is to be held by said chuck;
   means for adjusting said second pivot to incline the planar surface of the workpiece at a desired angle to the beam direction; and
   means for rotating said arm through an angle, thereby moving the workpiece through said ribbon ion beam on an arc-shaped path at a desired angular velocity and being effective to implant a desired substantially uniform dose of ions into the planar surface of the workpiece.

2. The apparatus as recited by claim 1 wherein said means for collimating said ribbon ion beam is a magnet whose entrance and exit pole edges and field profile are shaped to modify the current density profile of said ribbon ion beam so that the current density at different locations where the beam impinges on the workpiece is proportional to the distance of each location from the first pivot axis.

3. The apparatus as recited by claim 1 wherein said means for collimating said ion beam and said means for controlling the current density comprise two lenses or regions of electric or magnetic field, each having sextupole field components, said components being effective both to collimate said ion beam and to provide a linear variation in current density along the ion beam's major transverse axis at the location where said ion beam strikes the workpiece.

4. The apparatus as recited by claim 1 wherein the inclination of the second pivot is selected to enable the chuck to be rotated to a desired a convenient orientation for loading and unloading workpieces from the chuck, in a position clear of the ion beam, and said orientation may optionally be a horizontal plane.

5. The apparatus as recited by claim 1 wherein means for rotating said chuck about an axis normal to a planar surface of the workpiece is provided.

6. The apparatus as recited by claim 5 wherein said chuck is rotated through 180 degrees when 50% of the desired dose is implanted into the workpiece, thereby substantially canceling certain systematic errors in dose uniformity which would otherwise arise from the current density profile of the ribbon ion beam.

7. An apparatus for scanning a workpiece in two dimensions in a raster pattern through a fixed ion beam, said apparatus comprising
   means for generating a fixed ion beam traveling along a beam axis;
   an arm mounted on a first pivot, whose pivot axis is parallel to the beam axis and adjacent to said beam;

means for rotating said arm through an angle about said first pivot axis, said angle being defined by first and second angular limits;

means for translating said first pivot in a direction normal to said beam axis and approximately bisecting said angle between said first and second angular limits;

a support for a planar surface workpiece to be implanted, said support being attached to said arm by a second pivot whose axis is inclined to the first pivot, wherein the planar surface workpiece to be implanted is attached to said support, and said second pivot is adjusted and then fixed to incline the planar surface of the workpiece at a desired angle to said beam direction, and wherein the planar surface of the workpiece is implanted with a desired uniform dose of ions by rotating the arm through an angle, thereby moving the workpiece through said fixed ion beam on an arc-shaped path at a desired velocity, while slowly translating the pivot in a generally orthogonal direction, thereby causing the workpiece to move in an arc-shaped raster pattern through said fixed ion beam.

8. The apparatus as recited by claim 7 wherein said translation of the first pivot is accomplished in finite increments, moving only while the workpiece has been translated by said arm out of the fixed ion beam.

9. A method of implanting a workpiece with a ribbon ion beam, said method comprising the steps of:

mounting a single workpiece to a chuck attached to an arm, said arm being joined to a first pivot having a first pivot axis so that the workpiece may be moved in an arc-shaped path;

pivoting said chuck about a second axis inclined to said first pivot axis until the workpiece is held with its exposed plane surface at a desired angle to the said first pivot axis;

passing the ribbon ion beam through electrostatic or magnetic lenses whose field is shaped to render the ion trajectories approximately parallel with said first pivot axis; and rotating said chuck attached arm about said first pivot to move the workpiece through the ribbon ion beam at a constant angular velocity, thereby implanting the workpiece with a uniform dose of ions at a desired angle.

10. The method as recited by claim 9 further comprising the steps of:

passing the ribbon ion beam through at least two lenses having differently shaped regions of magnetic or electric field;

adjusting at least one of said lenses to modify the current density of the ribbon ion beam along its major axis; and simultaneously maintaining the ion beam trajectories to be substantially parallel to said first pivot axis, whereby as the ion beam strikes the workpiece at different locations in its surface, the current density at each location is proportional to the distance from said first pivot axis.

11. A method of implanting a workpiece with a scanned ion beam comprising the steps of:

mounting a single workpiece to a chuck attached to an arm, said arm being joined to a first pivot having a first pivot axis so that the workpiece may be moved in an arc-shaped path:

pivoting said chuck about a second axis inclined to the first pivot axis until the workpiece is held with its exposed plane surface at a desired angle to said first pivot axis;

rotating said arm about said first pivot to move the workpiece through the scanned ion beam in an arc-shaped path at a constant angular velocity; and translating the first pivot in a direction normal to the ion beam, and in a direction generally normal to the mid-point of the arc-shaped motion of the workpiece, thereby implanting a uniform dose of ions into the workpiece at a desired angle.

* * * * *